(12) United States Patent
Kuretake

(10) Patent No.: US 11,691,921 B2
(45) Date of Patent: Jul. 4, 2023

(54) LIGHT-EMITTING CERAMIC AND WAVELENGTH CONVERSION DEVICE

(71) Applicant: Murata Manufacturing Co., Ltd., Nagaokakyo (JP)

(72) Inventor: Satoshi Kuretake, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 788 days.

(21) Appl. No.: 16/701,595

(22) Filed: Dec. 3, 2019

(65) Prior Publication Data

US 2020/0102251 A1    Apr. 2, 2020

Related U.S. Application Data

(63) Continuation of application No. PCT/JP2018/009705, filed on Mar. 13, 2018.

(30) Foreign Application Priority Data

Aug. 24, 2017  (JP) .................................. 2017-161172

(51) Int. Cl.
*C04B 35/495* (2006.01)
*C09K 11/77* (2006.01)
*H01L 33/50* (2010.01)

(52) U.S. Cl.
CPC .......... *C04B 35/495* (2013.01); *H01L 33/502* (2013.01); *C04B 2235/3225* (2013.01); *C04B 2235/3227* (2013.01); *C04B 2235/3244* (2013.01); *C04B 2235/3251* (2013.01);
(Continued)

(58) Field of Classification Search
CPC ..... C09K 11/7714; C09K 11/77; C09K 11/75; C09K 11/74; C04B 35/495
See application file for complete search history.

(56) References Cited

U.S. PATENT DOCUMENTS

| | | |
|---|---|---|
| 8,674,310 B2 | 3/2014 | Kuretake |
| 9,202,995 B2 | 12/2015 | Kuretake |
| 10,000,696 B2 | 6/2018 | Kuretake |

(Continued)

FOREIGN PATENT DOCUMENTS

| | | |
|---|---|---|
| JP | 2009001443 A | 1/2009 |
| JP | 2012062394 A | 3/2012 |

(Continued)

OTHER PUBLICATIONS

Whittle, K.R. et al., The Role of Sn, Zr and Hf in the Radiation Damage in II, III, IV and V Pyrochlores, Materials Research Society symposia proceedings, 2012, vol. 1383, pp. 29-34 (Year: 2012).*

(Continued)

*Primary Examiner* — Matthew E. Hoban
(74) *Attorney, Agent, or Firm* — ArentFox Schiff LLP

(57) ABSTRACT

A light-emitting ceramic that includes a pyrochlore type compound that contains 0.01 mol % or more of Bi with respect to 100 mol % of the general formula $M1_xM2_yM3_zO_w$, wherein M1 is at least one of La, Y, Gd, Yb, and Lu, M2 is at least one of Zr, Sn, and Hf, M3 is at least one of Ta, Nb, and Sb, X, Y, Z, and W are positive numbers that maintain electrical neutrality, $X+Y+Z=2.0$, $0.005 \leq Z \leq 0.2$, and $3X+4Y+5Z$ is 7.02 or less.

20 Claims, 2 Drawing Sheets

(52) U.S. Cl.
CPC ............... *C04B 2235/3293* (2013.01); *C04B 2235/3294* (2013.01); *C04B 2235/3298* (2013.01)

(56) References Cited

U.S. PATENT DOCUMENTS

| | | | |
|---|---|---|---|
| 10,011,770 | B2 | 7/2018 | Kurosawa et al. |
| 2007/0026247 | A1* | 2/2007 | Paranthaman ...... H01L 39/2461 428/701 |
| 2013/1005697 | | 5/2013 | Kuretake |
| 2014/0209954 | A1 | 7/2014 | Kuretake |
| 2015/0329775 | A1 | 11/2015 | Kuretake |
| 2018/0100101 | A1 | 4/2018 | Kurosawa et al. |
| 2019/0106622 | A1 | 4/2019 | Kuretake |

FOREIGN PATENT DOCUMENTS

| | | |
|---|---|---|
| JP | 2015212311 A | 11/2015 |
| JP | 2016145310 A | 8/2016 |
| JP | 2017036160 A | 2/2017 |
| JP | 2017066245 A | 4/2017 |
| WO | 2011158580 A1 | 12/2011 |
| WO | 2013058065 A1 | 4/2013 |
| WO | 2014119416 A1 | 8/2014 |
| WO | 2015037395 A1 | 3/2015 |
| WO | 2016190439 A1 | 12/2016 |
| WO | 2018029906 A1 | 2/2018 |

OTHER PUBLICATIONS

Kuretake, Satoshi et al. Development of AB03- and AB207-type Transparent Ceramic Phosphors. Abstracts of the Annual Meeting of the Ceramic Society of Japan. Mar. 1, 2016, 2C04A, ISBN: 978-4-931298-71-2 C3058, non-official translation.

Mahesh et al., "Influence of Cation Substitution and Activator Site Exchange on the Photoluminescence Properties of EU3+ -Doped Quaternary Pyrochlore Oxides," Inorganic Chemistry, 2013, vol. 52, pp. 13304-13313.

International Search Report issued in PCT/JP2018/009705, dated Apr. 24, 2018.

Written Opinion of the International Searching Authority issued in PCT/JP2018/009705, dated Apr. 24, 2018.

\* cited by examiner

LIGHT-EMITTING CERAMIC AND WAVELENGTH CONVERSION DEVICE

CROSS REFERENCE TO RELATED APPLICATIONS

The present application is a continuation of International application No. PCT/JP2018/009705, filed Mar. 13, 2018, which claims priority to Japanese Patent Application No. 2017-161172, filed Aug. 24, 2017, the entire contents of each of which are incorporated herein by reference.

FIELD OF THE INVENTION

The present invention relates to a light-emitting ceramic and a wavelength conversion device including the light-emitting ceramic.

BACKGROUND OF THE INVENTION

Conventionally, there has been known a light-emitting ceramic that emits light having a wavelength different from that of light having been irradiated with. The light-emitting ceramic described in Patent Document 1 below is obtained by heat-treating a ceramic mainly including a pyrochlore type compound represented by $ABO_W$ (where A contains at least one selected from the group consisting of La, Y, Gd, Yb, and Lu, B contains at least one selected from the group consisting of Zr, Sn, and Hf and Bi, and W is a positive number for maintaining electrical neutrality) in a reducing atmosphere.

Patent Document 2 below describes that when a phosphor is exposed to light having a high energy density for a long time, the emission amount gradually decreases.

Patent Document 1: WO 2014/119416 A1
Patent Document 2: Japanese Patent Application Laid-Open No. 2012-62394

SUMMARY OF THE INVENTION

As described in Patent Document 2, when a phosphor is exposed to light having a high energy density for a long time, the emission amount gradually decreases. This phenomenon is referred to as photodegradation or photofading. In illumination applications and the like, a constant emission amount or emission color is always needed over a long period of time. Consequently, such photodegradation is desired to be eliminated.

If the light-emitting ceramic $ABO_W$ described in Patent Document 1 is used for a long time, photodegradation occurs. There has been a problem such that, particularly when the light-emitting ceramic $ABO_W$ is exposed to light having a short wavelength and a high energy density, the emission amount gradually decreases.

An object of the present invention is to provide a light-emitting ceramic which is less likely to cause photodegradation, and a wavelength conversion device containing that light-emitting ceramic.

A light-emitting ceramic according to the present invention includes a pyrochlore type compound that contains 0.01 mol % or more of Bi with respect to 100 mol % of a general formula $M1_xM2_yM3_zO_W$. In the general formula $M1_xM2_yM3_zO_W$, M1 is at least one element selected from the group consisting of La, Y, Gd, Yb, and Lu, M2 is at least one element selected from the group consisting of Zr, Sn, and Hf, M3 is at least one element selected from the group consisting of Ta, Nb, and Sb, X, Y, Z, and W are positive numbers that maintain electrical neutrality, X+Y+Z=2.0, 0.005≤Z≤0.2, and 3X+4Y+5Z is 7.02 or less.

In the light-emitting ceramic according to the present invention, 3X+4Y+5Z is preferably 6.92 or more. In this case, the light-emitting ceramic is less likely to cause photodegradation, and also has no deliquescence.

In the light-emitting ceramic according to the present invention, Z is preferably 0.02 or more, and more preferably 0.05 or more. In this case, photodegradation is much less likely to occur.

The light-emitting ceramic according to the present invention preferably contains 5 mol % or less of the Bi with respect to 100 mol % of the general formula $M1_xM2_yM3_zO_W$.

In the present specification, unless otherwise specified, the content (mol %) of the element is a ratio with respect to 100 mol % of $M1_xM2_yM3_zO_W$.

A wavelength conversion device according to the present invention includes a wavelength converter containing the light-emitting ceramic configured according to the present invention and a light source that irradiates the wavelength converter with ultraviolet rays.

It is to be noted that the term "light-emitting ceramic" used in the present application means a ceramic which absorbs at least part of energy of light when irradiated with light such as ultraviolet rays and emits the absorbed energy as light of a wavelength different from the wavelength of the irradiated light.

According to the present invention, it is possible to provide a light-emitting ceramic which is less likely to cause photodegradation even when exposed to light to the extent of excitation light and a wavelength conversion device having the light-emitting ceramic.

DETAILED DESCRIPTION OF THE INVENTION

Figure 1:
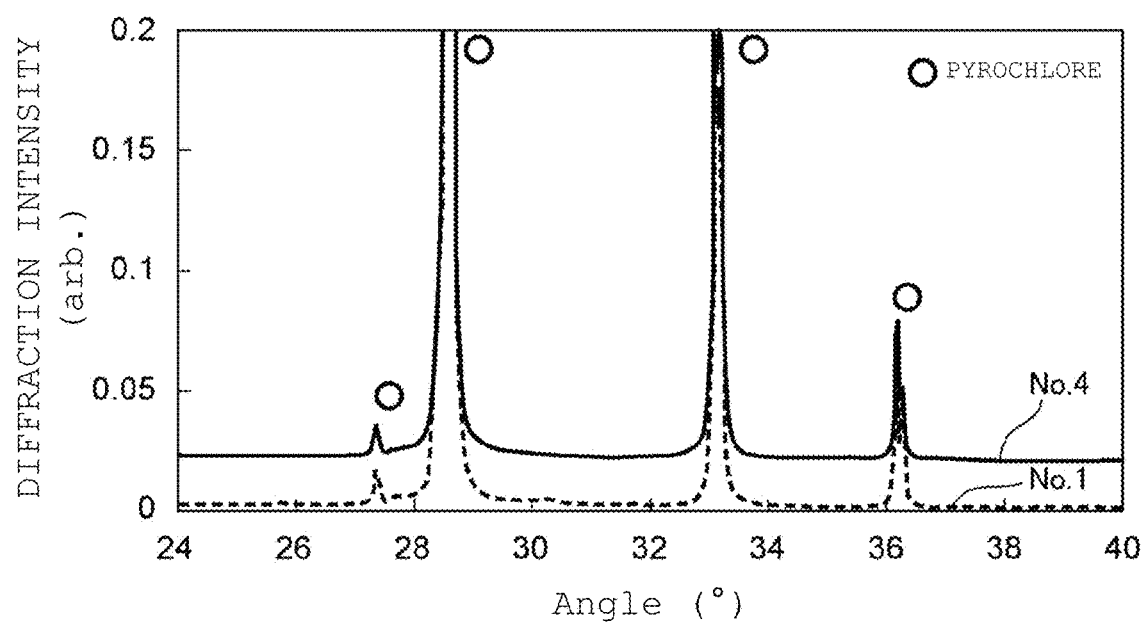
FIG. 1 is a diagram illustrating XRD diffraction patterns of light-emitting ceramic Nos. 1 and 4 prepared in experimental examples.

Hereinafter, details of the present invention and specific embodiments thereof will be described with reference to the drawings.

It is to be noted that the embodiments described in the present specification are illustrative and that partial replacement or combination of configurations is possible between different embodiments.

A light-emitting ceramic according to the present invention includes a pyrochlore type compound that contains 0.01 mol % or more of Bi with respect to 100 mol % of the general formula $M1_xM2_yM3_zO_W$, where M1 is at least one element selected from the group consisting of La, Y, Gd, Yb, and Lu, M2 is at least one element selected from the group consisting of Zr, Sn, and Hf, M3 is at least one element selected from the group consisting of Ta, Nb, and Sb, and X, Y, Z, and W are positive numbers that maintain electrical neutrality, X+Y+Z=2.0, 0.005≤Z≤0.2, and 3X+4Y+5Z is 7.02 or less.

The light-emitting ceramic according to the present invention can be obtained by firing a ceramic material having the above composition ratio and then heat-treating the fired product in a reducing atmosphere.

The light-emitting ceramic of the present invention is a ceramic and is thus easy to be manufactured as compared with a luminescent material having single crystals. In the above firing, the ceramic material may be fired in the form of powder, or may be fired after being once formed into a predetermined shape. In both cases, the light-emitting ceramic can be obtained by heat treatment in a reducing atmosphere. The light-emitting ceramic may be in the form of powder or may be dispersed in a resin or glass. The light-emitting ceramic, either in the form of powder or dispersed in a resin or glass, can be used as a material for producing an element having a wavelength conversion function.

The light-emitting ceramic $M1_XM2_YM3_ZO_W$ of the present invention is a pyrochlore type compound. In the present invention, the light-emitting ceramic $M1_XM2_YM3_ZO_W$ is defined as the pyrochlore type compound as long as the peak of (311) or (331), which is a superlattice peak in X-ray diffraction, can be seen.

In the light-emitting ceramic according to the present invention, 3X+4Y+5Z is preferably 6.92 or more. In that case, since the light-emitting ceramic has no deliquescence, a light-emitting ceramic suitable for the wavelength conversion device or the like can be provided.

Further, Z in the general formula $M1_XM2_YM3_ZO_W$ as described above is preferably 0.02 or more, and more preferably 0.05 or more. In that case, photodegradation is much less likely to occur.

In the present invention, the content of Bi is 0.01 mol % or more with respect to 100 mol % of the compound represented by the general formula $M1_XM2_YM3_ZO_W$. The content of Bi is preferably 0.05 mol % or more. Thus, the quantum yield of emission light can be further increased. The content of Bi is preferably 5 mol % or less. Thus, the quantum yield of emission light can be further increased. The content of Bi is more preferably 3 mol % or less, and still more preferably in a range of 1 mol % or less.

In order to obtain the light-emitting ceramic according to the present invention, it is preferable to use $Bi_2O_3$ as the Bi source.

When the light-emitting ceramic according to the present invention has a thickness of 1 mm, the light transmittance at a wavelength of 450 nm to 800 nm is preferably 50%. The light transmittance is more preferably 60% or more, and still more preferably 70% or more. This further enhances the translucency, and it is possible to provide a light-emitting ceramic more suitable for a wavelength conversion device, illumination or the like.

In the light-emitting ceramic according to the present invention, the emission quantum yield when irradiated with excitation light is preferably 40% or more, more preferably 50% or more, and still more preferably 60% or more.

(Method for Manufacturing Light-Emitting Ceramic)

The method for manufacturing the light-emitting ceramic of the present invention will be described.

First, ceramic raw material powder is formed into a predetermined shape, and an unfired ceramic formed body as a ceramic material is obtained. Next, the unfired ceramic formed body is fired in an atmosphere containing oxygen. As a result, a ceramic $M1_XM2_YM3_ZO_W$ is obtained.

Preferably, the firing atmosphere for obtaining the ceramic $M1_XM2_YM3_ZO_W$ has an oxygen concentration of 98 vol % or more. The firing temperature (maximum temperature) can be, for example, about 1500° C. or more and about 1800° C. or less. The holding time of the firing temperature (maximum temperature) in the firing step can be, for example, about 5 hours or more and about 100 hours or less.

Subsequently, the resulting ceramic $M1_XM2_YM3_ZO_W$ is heat-treated in a reducing atmosphere. As a result, a light-emitting ceramic is obtained. The reducing atmosphere is not particularly limited, and may be, for example, an $H_2/H_2O$ atmosphere. The temperature (maximum temperature) in the heat treatment is preferably, for example, 800° C. or more and 1200° C. or less, and more preferably 900° C. or more and 1100° C. or less. The holding time in the heat treatment temperature (maximum temperature) can be, for example, about 1 hour or more and about 100 hours or less.

The light transmittance of the light-emitting ceramic at a wavelength of 400 nm or more and 600 nm or less is improved by the heat treatment as described above. Holes generated during firing serve as color centers and absorb light having a wavelength of 400 nm or more and 600 nm or less. On the other hand, it is considered that as a result of the heat treatment in the reducing atmosphere, the holes serving as the color centers are neutralized with electrons supplied from the oxygen side before reduction, so that the light transmittance is increased.

The light-emitting ceramic according to the present invention is represented by $M1_XM2_YM3_ZO_W$, and may contain impurities unavoidably mixed, i.e., unavoidable impurities other than M1, M2, M3, and O. Examples of the unavoidable impurities include $SiO_2$, $B_2O_3$, and $Al_2O_3$.

(Embodiment of Wavelength Conversion Device)

Figure 4:
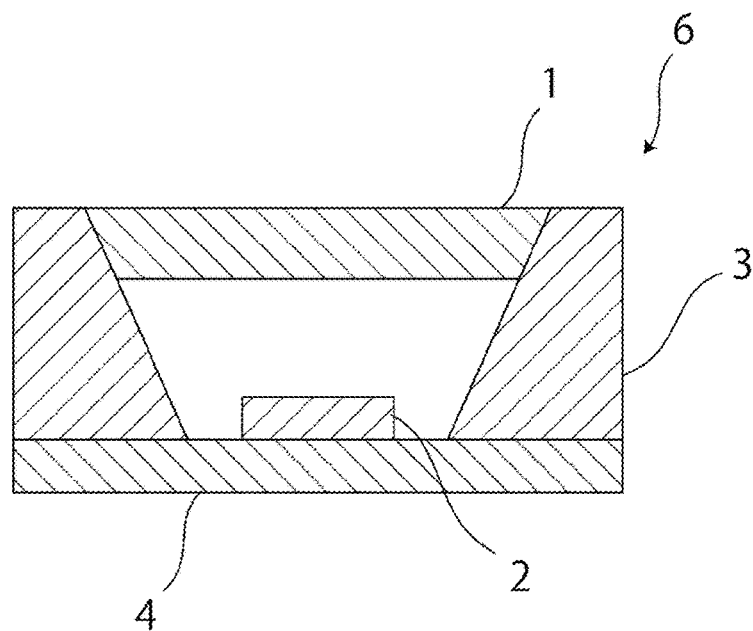
FIG. 4 is a schematic configuration diagram illustrating a wavelength conversion device as an embodiment of the present invention.

FIG. 4 is a schematic configuration diagram illustrating a wavelength conversion device as an embodiment of the present invention.

A wavelength conversion device 6 is used for illumination or the like, and includes a wavelength converter 1 and a light source 2. The wavelength converter 1 is made of the light-emitting ceramic of the present invention. The light source 2 emits ultraviolet rays. The light source 2 is provided on a substrate 4. A reflector 3 is disposed on the substrate 4 so as to surround the periphery of the light source 2 and surround the optical axis of ultraviolet rays emitted from the light source 2. The wavelength converter 1 is fixed to the light emitting side end of the reflector 3 and is opposed to the light source 2 at a position separated from the light source 2. For example, an LED or the like can be used as the light source 2.

When the wavelength conversion device 6 is driven, excitation light is emitted from the light source 2 toward the wavelength converter 1. Part of the excitation light is reflected by the reflector 3 and reaches the wavelength converter 1. The wavelength converter 1 is excited by the excitation light and emits light.

Although the wavelength conversion device 6 has been described, the wavelength conversion device of the present invention is not limited to the wavelength conversion device 6 illustrated in FIG. 4, and may be a wavelength conversion device that has various forms and includes a wavelength converter made of the light-emitting ceramic of the present invention and a light source for emitting light to the light-emitting ceramic.

EXPERIMENTAL EXAMPLES

Subsequently, the present invention will be described in more detail by describing experimental examples of light-emitting ceramics of the present invention. It is to be noted that the present invention is not limited to the following experimental examples.

Hereinafter, the present invention will be described more specifically by way of specific experimental examples of the present invention.

Experimental Example 1

As raw materials, $La(OH)_3$, $Gd_2O_3$, $Y_2O_3$, $Yb_2O_3$, $Lu_2O_3$, $ZrO_2$, $HfO_2$, $SnO_2$, $Nb_2O_5$, $Ta_2O_5$, $Sb_2O_3$, and $Bi_2O_3$ were prepared. These raw materials were weighed so as to have the composition represented by the molar ratios in the following Table 1 and wet-mixed with a ball mill for 20 hours. The resulting mixture was dried and then calcined at 1300° C. for 3 hours to obtain a calcined product. The resulting calcined product was placed in a ball mill together with water and an organic dispersant and wet-pulverized for 12 hours. The resulting pulverized product was formed into a disk shape having a diameter of 30 mm and a thickness of 5 mm by a wet forming method. The resulting formed product was put into a powder body having the same composition as that of the formed product, and fired at a temperature of 1700° C. for 20 hours in an oxygen atmosphere with (an oxygen concentration of about 98 vol %). Thereby, a sintered body was obtained.

The resulting sintered body was cut into a rectangular plate shape (5 mm square and 1.2 mm thickness) by a crystal cutter. The rectangular plate-shaped sintered body obtained by cutting was heat-treated in an atmosphere of $N_2/H_2/H_2O$ mixed gas (oxygen partial pressure: $1.7 \times 10^{-13}$ MPa). The temperature for the heat treatment, i.e., maximum temperature was 1000° C., and the holding time at 1000° C. was set to 3 hours. Both surfaces of the rectangular plate-shaped sintered body after the heat treatment were mirror-polished so as to be a substrate having a thickness of 0.5 mm, and the resulting substrate was used as an evaluation sample.

According to the procedures as described above, sample Nos. 1 to 14 shown in Table 1 below were obtained. The composition ratio for charging in Table 1 is a molar ratio. This molar ratio is normalized so that $X+Y+Z=2.0$.

Further, since M1 is a trivalent ion, M2 is a tetravalent ion, and M3 is a pentavalent ion, values of X, Y, and Z are set so that the total charge of cations in these ions are not inconsistent with the general formula $A_2B_2O_7$ of the pyrochlore type compound. In Experimental Example 1, the values of X, Y, and Z were set so as to satisfy $3X+4Y+5Z=7.0$ or near $3X+4Y+5Z=7.0$.

Further, in order to obtain the above evaluation samples, XRF composition analysis was performed based on the composition of the calcined product obtained in the middle of the process. As a result, a sintered body having the intended composition was obtained, and it was confirmed that there was no significant volatilization of components in the composition.

Further, XRD analysis was performed on the resulting evaluation samples. FIG. 1 illustrates XRD diffraction patterns of sample Nos. 1 and 4. As is clear from FIG. 1, it can be seen that both sample Nos. 1 and 4 have substantially a single phase of pyrochlore structure. The results of sample Nos. 1 and 4 are representatively shown in FIG. 1, and it is confirmed that the other samples also have a single phase of pyrochlore structure.

Regarding the resulting samples, the emission quantum yield at an excitation wavelength of 365 nm was measured using an absolute PL quantum yield measurement system (product number: C9920-02, manufactured by Hamamatsu Photonics K.K.). The results are shown in Table 1 below.

Further, each of the samples had transparency. The linear transmittance of each of the samples at 700 nm was measured using an ultraviolet-visible spectrophotometer (product number: UV-2500PC, manufactured by Shimadzu Corporation). Table 1 below also shows the linear transmittance.

(Evaluation of Photodegradation)

Figure 2:
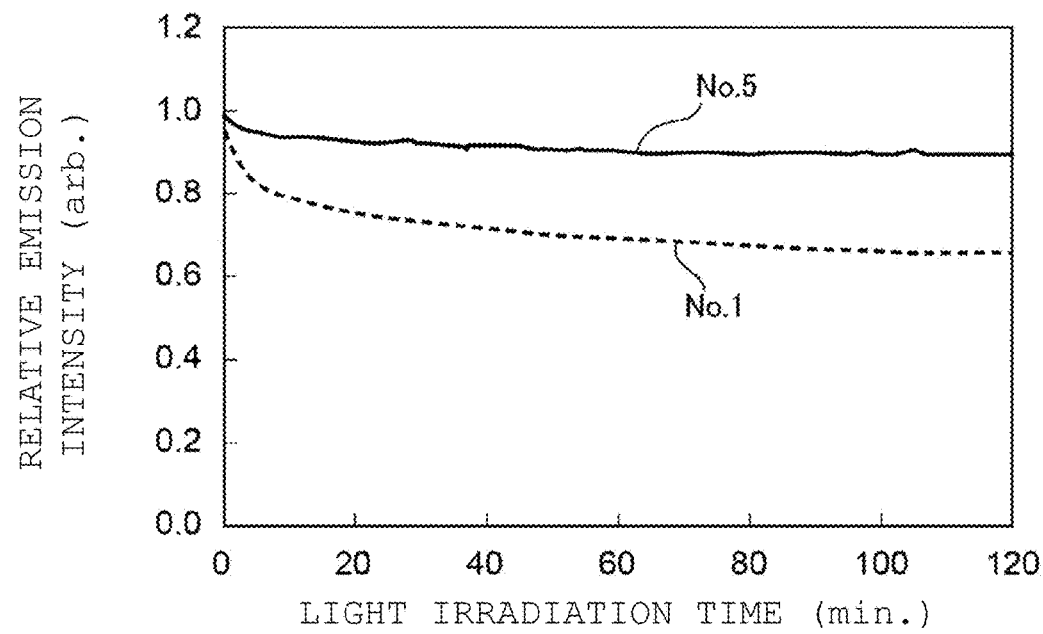
FIG. 2 is a diagram illustrating temporal changes in emission intensity in the case of using light-emitting ceramic Nos. 1 and 5.

The surfaces of the resulting evaluation samples were irradiated with a He—Cd laser having a wavelength of 325 nm and an output of 10 mW for 120 minutes using a photoluminescence measuring device (manufactured by Seishin Trading Co., Ltd.). The temporal change of the emission intensity obtained from each of the samples in the above process was measured. The monitoring wavelength of the emission intensity was set to 580 nm. As examples of the measurement results, FIG. 2 shows temporal changes of emission intensities of sample Nos. 1 and 5. As is clear from FIG. 2, a decrease in emission intensity was particularly remarkable for several minutes after the start of light irradiation, and thereafter, the amount of decrease in the emission intensity was small with time, and the emission intensity showed a tendency of saturation. In this experimental example, the photodegradation of each sample was evaluated based on a relative emission intensity. Here, the relative emission intensity refers to a ratio of the emission intensity after 120 minutes of irradiation to the emission intensity immediately after the irradiation. The relative emission intensity measured as described above is also shown in Table 1 below.

TABLE 1

| Sample No. | Composition ratio for charging | | | | | | | | | | | $X + Y + Z$ | $Z$ | $3X + 4Y + 5Z$ | Linear transmittance at 700 nm | Quantum yield excited at 365 nm | Relative emission intensity at 580 nm |
|---|---|---|---|---|---|---|---|---|---|---|---|---|---|---|---|---|---|
| | $M1_X$ | | | | $M2_Y$ | | | $M3_Z$ | | | | | | | | | |
| | La | Gd | Y | Yb | Lu | Zr | Sn | Hf | Ta | Nb | Sb | Bi | | | | | | |
| 1* | 1.000 | | | | | 1.000 | | | | | | 0.0010 | 2.000 | 0.000 | 7.000 | 74.3 | 92.0 | 0.66 |
| 2* | 1.002 | | | | | 0.996 | | | 0.002 | | | 0.0010 | 2.000 | 0.002 | 7.000 | 74.5 | 93.0 | 0.68 |
| 3 | 1.005 | | | | | 0.990 | | | 0.005 | | | 0.0010 | 2.000 | 0.005 | 7.000 | 74.5 | 89.6 | 0.75 |
| 4 | 1.020 | | | | | 0.980 | | | 0.020 | | | 0.0010 | 2.000 | 0.020 | 7.000 | 74.2 | 91.4 | 0.88 |
| 5 | 1.050 | | | | | 0.900 | | | 0.050 | | | 0.0010 | 2.000 | 0.050 | 7.000 | 74.3 | 90.2 | 0.90 |
| 6 | 1.100 | | | | | 0.800 | | | 0.100 | | | 0.0010 | 2.000 | 0.100 | 7.000 | 74.4 | 89.8 | 0.94 |
| 7 | 1.200 | | | | | 0.600 | | | 0.200 | | | 0.0010 | 2.000 | 0.200 | 7.000 | 74.0 | 82.8 | 0.92 |
| 8* | 1.400 | | | | | 0.200 | | | 0.400 | | | 0.0010 | 2.000 | 0.400 | 7.000 | 18.2 | 21.4 | — |
| 9* | 0.990 | | | | | 1.010 | | | | | | 0.0010 | 2.000 | 0.000 | 7.010 | 52.1 | 88.1 | 0.64 |
| 10* | 1.020 | | | | | 0.980 | | | | | | 0.0010 | 2.000 | 0.000 | 6.980 | 73.5 | 90.3 | 0.65 |
| 11 | 1.020 | | | | | 0.960 | | | 0.020 | | | 0.0001 | 2.000 | 0.020 | 7.000 | 72.5 | 84.4 | 0.87 |
| 12 | 1.020 | | | | | 0.960 | | | 0.020 | | | 0.0050 | 2.000 | 0.020 | 7.000 | 73.0 | 80.3 | 0.86 |

TABLE 1-continued

| Sample No. | Composition ratio for charging | | | | | | | | | | | X + Y + Z | 3X + Z | 3X + 4Y + 5Z | Linear transmittance at 700 nm | Quantum yield excited at 365 nm | Relative emission intensity at 580 nm |
|---|---|---|---|---|---|---|---|---|---|---|---|---|---|---|---|---|---|
| | M1$_X$ | | | | M2$_Y$ | | | M3$_Z$ | | | | | | | | | |
| | La | Gd | Y | Yb | Lu | Zr | Sn | Hf | Ta | Nb | Sb | Bi | | | | | | |
| 13 | 1.020 | | | | | 0.960 | | | 0.020 | | | 0.0300 | 2.000 | 0.020 | 7.000 | 69.8 | 51.2 | 0.86 |
| 14 | 1.020 | | | | | 0.960 | | | 0.020 | | | 0.0500 | 2.000 | 0.020 | 7.000 | 62.0 | 40.1 | 0.88 |

Table 1 shows that, in sample No. 1 where Z=0, the quantum yield was 80% or more and the linear transmittance was 70% or more. That is, sample No. 1 is a light-emitting ceramic having high transparency and excellent light transmittance. However, the relative emission intensity is less than 0.7, and significant photodegradation is observed in sample No. 1.

On the other hand, in all of sample Nos. 3 to 7 containing Ta with Z=0.005 to 0.200 as a pentavalent ion, the relative emission intensity is 0.75 or more. Hence, the fact shows that photodegradation can be reduced. Further, when the composition of each of sample Nos. 3 to 7 is compared with the composition of sample No. 1, the amount of La is increased and the amount of Zr is decreased in sample Nos. 3 to 7, except for the presence or absence of Ta.

The results of sample Nos. 9 and 10 show that if the component ratio of La and Zr in the composition is only changed, there is no effect on the characteristics of photodegradation. Therefore, it can be seen from the above results that the use of Ta as a pentavalent ion is effective in reducing the photodegradation.

Further, the results of sample No. 2 show that when Z is 0.002 or less, the effect of reducing photodegradation is decreased, so that this is not preferable. Furthermore, the results of sample No. 8 show that when Z is 0.400 or more, the quantum yield and the light transmittance are lowered, so that this is not preferable. Therefore, it is desirable that Z be preferably in a range of more than 0.002 and less than 0.400, and more preferably 0.005 or more and 0.200 or less. In that case, the quantum yield and the light transmittance are good, and the photodegradation can be effectively reduced.

Further, as is clear from the results of sample Nos. 11 and 12, it is found that even if the amount of Bi charged is increased or decreased, the degree of reduction of photodegradation due to the use of Ta as a pentavalent ion is not affected.

As is clear from the results of sample Nos. 13 and 14, it is found that the quantum yield of sample No. 13 containing 0.0300 mol % of Bi with respect to 100 mol % of $M1_XM2_YM3_ZO_W$ and the quantum yield of sample No. 14 containing 0.0500 mol % of Bi with respect to 100 mol % of $M1_XM2_YM3_ZO_W$ are slightly decreased, as compared with those of sample Nos. 4, 11, and 12 as mentioned above; however, the relative emission intensity of each of sample Nos. 13 and 14 show a sufficient value.

Experimental Example 2

Evaluation samples of sample Nos. 15 to 42 shown in Tables 2, 3, and 4 below were obtained in the same manner as in Experimental Example 1.

The quantum yield, linear transmittance, and relative emission intensity of the resulting evaluation samples were determined in the same manner as in Experimental Example 1. The results are shown in Tables 2, 3, and 4 below. The composition ratios for charging in Tables 2, 3, and 4 are molar ratios, which are values normalized so that X+Y+Z=2.0. In the same manner as in Experimental Example 1, the values of X, Y, and Z were set so as to satisfy 3X+4Y+5Z=7.0 or near 3X+4Y+5Z=7.0. Tables 2, 3, and 4 below also show the values of X, Y, and Z.

TABLE 2

| Sample No. | Composition ratio for charging | | | | | | | | | | | X + Y + Z | 3X + Z | 3X + 4Y + 5Z | Linear transmittance at 700 nm | Quantum yield excited at 365 nm | Relative emission intensity at 580 nm |
|---|---|---|---|---|---|---|---|---|---|---|---|---|---|---|---|---|---|
| | M1$_X$ | | | | | M2$_Y$ | | | M3$_Z$ | | | | | | | | | |
| | La | Gd | Y | Yb | Lu | Zr | Sn | Hf | Ta | Nb | Sb | Bi | | | | | | |
| 15* | 1.010 | | | | | 0.940 | | | 0.050 | | | 0.0010 | 2.000 | 0.050 | 7.040 | 21.2 | 4.8 | — |
| 16 | 1.030 | | | | | 0.920 | | | 0.050 | | | 0.0010 | 2.000 | 0.050 | 7.020 | 54.6 | 51.8 | 0.89 |
| 17 | 1.130 | | | | | 0.820 | | | 0.050 | | | 0.0010 | 2.000 | 0.050 | 6.920 | 71.8 | 81.6 | 0.91 |
| 18* | 1.150 | | | | | 0.800 | | | 0.050 | | | 0.0010 | 2.000 | 0.050 | 6.900 | 62.1 | 74.6 | 0.89 |

Figure 3:
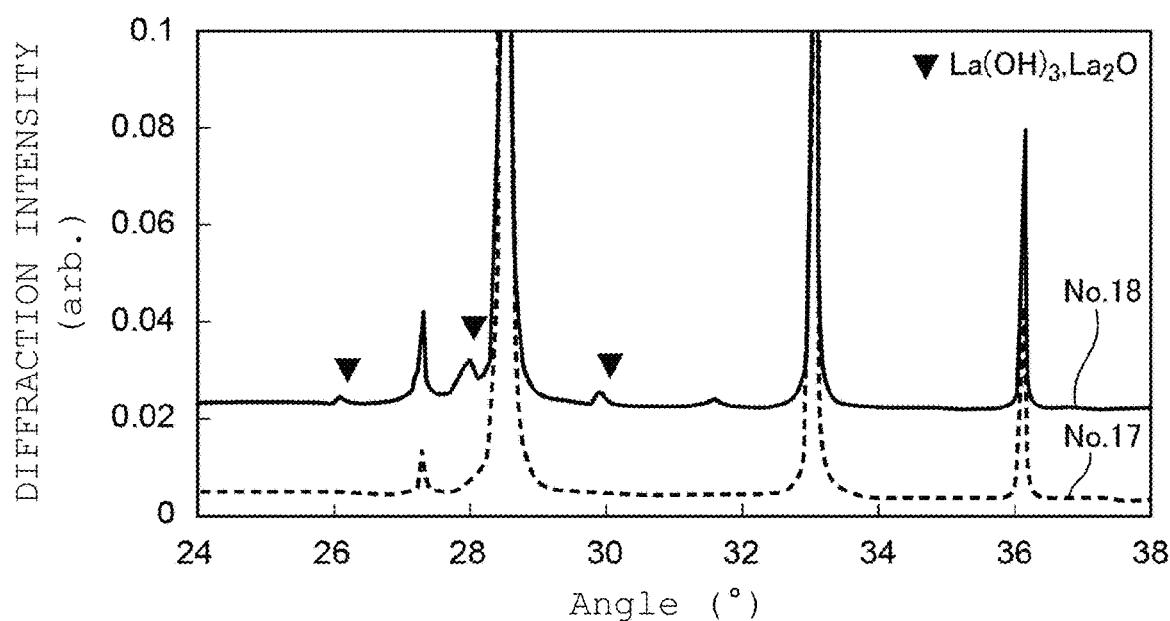
FIG. 3 is a diagram illustrating XRD diffraction patterns of light-emitting ceramic Nos. 17 and 18.

Table 2 shows the results of sample Nos. 15 to 18 containing Ta with Z=0.050 as a pentavalent ion when the total charge of cations (i.e., 3X+4Y+5Z) deviated from 7.000. From the result of sample No. 15, when the total charge is 7.040 or more, the quantum yield and the linear transmittance decrease, so that this is not preferable. As is clear from the results of sample No. 18, when the total charge is 6.900, the quantum yield and the linear transmittance are high, and photodegradation is less likely to occur. However, the XRD diffraction patterns of sample Nos. 17 and 18, illustrated in FIG. 3, show that unreacted La remains in the sample when the total charge is 6.900 or less. Thus, the sample shows deliquescence and this is not preferable. Therefore, the total charge of cations (i.e., 3X+4Y+5Z) is preferably 6.92 or more.

The above total charge is preferably 7.02 or less.

TABLE 3

| Sample No. | Composition ratio for charging | | | | | | | | | | | X + Y + Z | Z | 3X + 4Y + 5Z | Linear transmittance at 700 nm | Quantum yield excited at 365 nm | Relative emission intensity at 580 nm |
|---|---|---|---|---|---|---|---|---|---|---|---|---|---|---|---|---|---|
| | M1$_X$ | | | | | M2$_Y$ | | | M3$_Z$ | | | | | | | | | |
| | La | Gd | Y | Yb | Lu | Zr | Sn | Hf | Ta | Nb | Sb | Bi | | | | | | |
| 19 | 1.020 | | | | | 0.960 | | | 0.010 | 0.010 | | 0.0010 | 2.000 | 0.020 | 7.000 | 73.1 | 90.2 | 0.86 |
| 20 | 1.020 | | | | | 0.960 | | | | 0.020 | | 0.0010 | 2.000 | 0.020 | 7.000 | 73.1 | 88.3 | 0.90 |
| 21 | 1.020 | | | | | 0.960 | | | 0.010 | | 0.010 | 0.0010 | 2.000 | 0.020 | 7.000 | 72.6 | 88.1 | 0.88 |
| 22 | 1.020 | | | | | 0.960 | | | | | 0.020 | 0.0010 | 2.000 | 0.020 | 7.000 | 72.9 | 89.4 | 0.87 |

In sample Nos. 19 to 22 shown in Table 3, the results are shown when the pentavalent ion is Nb or Sb, or a combination of Ta, Nb, and Sb. As is clear from Table 3, it is found that photodegradation can be effectively reduced when Nb and Sb are used or when a combination of the elements as the pentavalent ions is used.

TABLE 4

| Sample No. | Composition ratio for charging | | | | | | | | | | | |
|---|---|---|---|---|---|---|---|---|---|---|---|---|
| | M1$_X$ | | | | | M2$_Y$ | | | M3$_Z$ | | | |
| | La | Gd | Y | Yb | Lu | Zr | Sn | Hf | Ta | Nb | Sb | Bi |
| 23* | 1.020 | | | | | 0.980 | | | | | | 0.0010 |
| 24 | 1.020 | | | | | 0.960 | | | 0.020 | | | 0.0010 |
| 25* | 1.020 | | | | | | | 0.980 | | | | 0.0010 |
| 26 | 1.020 | | | | | | | 0.960 | 0.020 | | | 0.0010 |
| 27 | 1.020 | | | | | 0.500 | 0.460 | | 0.020 | | | 0.0010 |
| 28 | 1.020 | | | | | 0.500 | | 0.460 | 0.020 | | | 0.0010 |
| 29* | | 1.020 | | | | 0.980 | | | | | | 0.0010 |
| 30 | | 1.020 | | | | 0.960 | | | 0.020 | | | 0.0010 |
| 31* | | | 1.020 | | | 0.980 | | | | | | 0.0010 |
| 32 | | | 1.020 | | | 0.960 | | | 0.020 | | | 0.0010 |
| 33* | | | | 1.020 | | 0.980 | | | | | | 0.0010 |
| 34 | | | | 1.020 | | 0.960 | | | 0.020 | | | 0.0010 |
| 35* | | | | | 1.020 | 0.980 | | | | | | 0.0010 |
| 36 | | | | | 1.020 | 0.960 | | | 0.020 | | | 0.0010 |
| 37 | 0.800 | 0.060 | 0.060 | 0.050 | 0.050 | 0.960 | | | 0.020 | | | 0.0010 |
| 38 | 0.800 | 0.060 | 0.060 | 0.050 | 0.050 | 0.480 | 0.480 | | 0.020 | | | 0.0010 |
| 39 | 0.800 | 0.060 | 0.060 | 0.050 | 0.050 | 0.480 | 0.240 | 0.240 | 0.020 | | | 0.0010 |
| 40 | 0.800 | 0.060 | 0.060 | 0.050 | 0.050 | 0.480 | 0.240 | 0.240 | 0.010 | 0.010 | | 0.0010 |
| 41 | 0.800 | 0.060 | 0.060 | 0.050 | 0.050 | 0.480 | 0.240 | 0.240 | | 0.010 | 0.010 | 0.0010 |
| 42 | 0.800 | 0.060 | 0.060 | 0.050 | 0.050 | 0.480 | 0.240 | 0.240 | 0.010 | | 0.010 | 0.0010 |

| Sample No. | X + Y + Z | Z | 3X + 4Y + 5Z | Linear transmittance at 700 nm | Quantum yield excited at 365 nm | Relative emission intensity at 580 nm |
|---|---|---|---|---|---|---|
| 23* | 2.000 | 0.000 | 6.980 | 88.3 | 55.8 | 0.52 |
| 24 | 2.000 | 0.020 | 7.000 | 72.2 | 54.7 | 0.84 |
| 25* | 2.000 | 0.000 | 6.980 | 71.9 | 85.0 | 0.65 |

TABLE 4-continued

| | | | | | | |
|---|---|---|---|---|---|---|
| 26 | 2.000 | 0.020 | 7.000 | 73.1 | 83.9 | 0.87 |
| 27 | 2.000 | 0.020 | 7.000 | 68.4 | 76.0 | 0.85 |
| 28 | 2.000 | 0.020 | 7.000 | 67.3 | 83.0 | 0.85 |
| 29* | 2.000 | 0.000 | 6.980 | 42.5 | 53.6 | 0.51 |
| 30 | 2.000 | 0.020 | 7.000 | 41.8 | 50.4 | 0.79 |
| 31* | 2.000 | 0.000 | 6.980 | 48.2 | 42.1 | 0.52 |
| 32 | 2.000 | 0.020 | 7.000 | 40.3 | 44.6 | 0.81 |
| 33* | 2.000 | 0.000 | 6.980 | 47.5 | 46.7 | 0.68 |
| 34 | 2.000 | 0.020 | 7.000 | 43.6 | 43.8 | 0.83 |
| 35* | 2.000 | 0.000 | 6.980 | 64.2 | 41.2 | 0.69 |
| 36 | 2.000 | 0.020 | 7.000 | 63.1 | 43.9 | 0.81 |
| 37 | 2.000 | 0.020 | 7.000 | 71.2 | 74.8 | 0.84 |
| 38 | 2.000 | 0.020 | 7.000 | 69.4 | 53.2 | 0.86 |
| 39 | 2.000 | 0.020 | 7.000 | 68.7 | 60.1 | 0.82 |
| 40 | 2.000 | 0.020 | 7.000 | 68.9 | 62.4 | 0.80 |
| 41 | 2.000 | 0.020 | 7.000 | 64.4 | 58.8 | 0.80 |
| 42 | 2.000 | 0.020 | 7.000 | 65.8 | 61.3 | 0.81 |

In sample Nos. 23 to 42 in Table 4, the results are shown when various elements are used as elements of M1, M2, and M3, or when these elements are used in combination. As is clear from Table 4, it is found that when M1 is other than La, when M2 is other than Zr, and when M3 is other than Ta, if Z is 0.005 or more and 0.200 or less, it is possible to more effectively reduce photodegradation. Further, it is found that the total charge (i.e., 3X+4Y+5Z) is preferably 6.92 or more, and thus it is possible to more effectively reduce photodegradation. Furthermore, it is found that when 3X+4Y+5Z is 7.02 or less, photodegradation is effectively reduced.

DESCRIPTION OF REFERENCE SYMBOLS

1: Wavelength converter
2: Light source
3: Reflector
4: Substrate
6: Wavelength conversion device

The invention claimed is:

1. A light-emitting ceramic comprising:
a pyrochlore type compound that contains 0.01 mol % or more of Bi with respect to 100 mol % of a general formula $M1_X M2_Y M3_Z O_W$, wherein
M1 is at least one element selected from the group consisting of La, Y, Gd, Yb, and Lu,
M2 is at least one element selected from the group consisting of Zr, Sn, and Hf,
M3 is at least one element selected from the group consisting of Ta, Nb, and Sb,
X, Y, Z, and W are positive numbers that maintain electrical neutrality, $$X+Y+Z=2.0,$$

$$0.005 \leq Z \leq 0.2,$$

3X+4Y+5Z is 7.02 or less, and
when the light-emitting ceramic has a thickness of 0.5 mm, the linear transmittance at a wavelength of 700 nm is 40% or more.

2. The light-emitting ceramic according to claim 1, wherein 3X+4Y+5Z is 6.92 to 7.02.

3. The light-emitting ceramic according to claim 2, wherein $0.02 \leq Z \leq 0.2$.

4. The light-emitting ceramic according to claim 1, wherein $0.02 \leq Z \leq 0.2$.

5. The light-emitting ceramic according to claim 2, wherein $0.05 \leq Z \leq 0.2$.

6. The light-emitting ceramic according to claim 1, wherein $0.05 \leq Z \leq 0.2$.

7. The light-emitting ceramic according to claim 1, wherein the pyrochlore type compound contains 5 mol % or less of the Bi with respect to 100 mol % of the general formula $M1_X M2_Y M3_Z O_W$.

8. The light-emitting ceramic according to claim 1, wherein the pyrochlore type compound contains 0.05 mol % or more of the Bi with respect to 100 mol % of the general formula $M1_X M2_Y M3_Z O_W$.

9. The light-emitting ceramic according to claim 1, wherein the pyrochlore type compound contains 3 mol % or less of the Bi with respect to 100 mol % of the general formula $M1_X M2_Y M3_Z O_W$.

10. The light-emitting ceramic according to claim 1, wherein the pyrochlore type compound contains 1 mol % or less of the Bi with respect to 100 mol % of the general formula $M1_X M2_Y M3_Z O_W$.

11. The light-emitting ceramic according to claim 1, wherein
M1 is a trivalent ion of the at least one element selected from the group consisting of La, Y, Gd, Yb, and Lu,
M2 is a tetravalent ion of the at least one element selected from the group consisting of Zr, Sn, and Hf,
M3 is a pentavalent ion of the at least one element selected from the group consisting of Ta, Nb, and Sb.

12. A wavelength conversion device comprising:
a wavelength converter containing a light-emitting ceramic that comprises:
a pyrochlore type compound that contains 0.01 mol % or more of Bi with respect to 100 mol % of a general formula $M1_X M2_Y M3_Z O_W$, wherein
M1 is at least one element selected from the group consisting of La, Y, Gd, Yb, and Lu,
M2 is at least one element selected from the group consisting of Zr, Sn, and Hf,
M3 is at least one element selected from the group consisting of Ta, Nb, and Sb,
X, Y, Z, and W are positive numbers that maintain electrical neutrality, $$X+Y+Z=2.0,$$

$$0.005 \leq Z \leq 0.2, \text{ and}$$

3X+4Y+5Z is 7.02 or less; and
a light source that irradiates the wavelength converter with ultraviolet rays.

13. The wavelength conversion device according to claim 12, wherein, in the light-emitting ceramic, 3X+4Y+5Z is 6.92 to 7.02.

14. The wavelength conversion device according to claim 12, wherein, in the light-emitting ceramic, $0.02 \leq Z \leq 0.2$.

15. The wavelength conversion device according to claim 12, wherein, in the light-emitting ceramic, $0.05 \leq Z \leq 0.2$.

16. The wavelength conversion device according to claim 12, wherein, in the light-emitting ceramic, the pyrochlore type compound contains 5 mol % or less of the Bi with respect to 100 mol % of the general formula $M1_xM2_yM3_zO_w$.

17. The wavelength conversion device according to claim 12, wherein, in the light-emitting ceramic, the pyrochlore type compound contains 0.05 mol % or more of the Bi with respect to 100 mol % of the general formula $M1_xM2_yM3_zO_w$.

18. The wavelength conversion device according to claim 12, wherein, in the light-emitting ceramic, the pyrochlore type compound contains 3 mol % or less of the Bi with respect to 100 mol % of the general formula $M1_xM2_yM3_zO_w$.

19. The wavelength conversion device according to claim 12, wherein, in the light-emitting ceramic, the pyrochlore type compound contains 1 mol % or less of the Bi with respect to 100 mol % of the general formula $M1_xM2_yM3_zO_w$.

20. The wavelength conversion device according to claim 12, wherein, in the light-emitting ceramic:
   M1 is a trivalent ion of the at least one element selected from the group consisting of La, Y, Gd, Yb, and Lu,
   M2 is a tetravalent ion of the at least one element selected from the group consisting of Zr, Sn, and Hf,
   M3 is a pentavalent ion of the at least one element selected from the group consisting of Ta, Nb, and Sb.

* * * * *